United States Patent
Lee

(10) Patent No.: US 11,670,456 B2
(45) Date of Patent: *Jun. 6, 2023

(54) MULTILAYER CERAMIC CAPACITOR AND METHOD OF MANUFACTURING THE SAME

(71) Applicant: SAMSUNG ELECTRO-MECHANICS CO., LTD., Suwon-si (KR)

(72) Inventor: Su Hyoung Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 19 days.

This patent is subject to a terminal disclaimer.

(21) Appl. No.: 17/104,085

(22) Filed: Nov. 25, 2020

(65) Prior Publication Data

US 2021/0082626 A1    Mar. 18, 2021

Related U.S. Application Data

(63) Continuation of application No. 16/161,807, filed on Oct. 16, 2018, now Pat. No. 10,886,067.

(30) Foreign Application Priority Data

Aug. 14, 2018   (KR) .................. 10-2018-0094925

(51) Int. Cl.
*H01G 4/30*    (2006.01)
*H01G 4/12*    (2006.01)
(Continued)

(52) U.S. Cl.
CPC .............. *H01G 4/30* (2013.01); *H01G 4/005* (2013.01); *H01G 4/12* (2013.01); *H05K 1/181* (2013.01); *H05K 2201/10015* (2013.01)

(58) Field of Classification Search
CPC ........ H01G 4/012; H01G 4/1227; H01G 4/33; H01G 4/248; H01G 4/1218; H01G 4/005;
(Continued)

(56) References Cited

U.S. PATENT DOCUMENTS 9,042,081 B2    5/2015  Kim
9,336,948 B2    5/2016  Awata et al.
(Continued)

FOREIGN PATENT DOCUMENTS

CN    1808649 A    7/2006
CN    103854850 A   6/2014
(Continued)

OTHER PUBLICATIONS

Non-Final Office Action dated Apr. 3, 2020 in U.S. Appl. No. 16/161,807.

(Continued)

*Primary Examiner* — Michael P McFadden
(74) *Attorney, Agent, or Firm* — Morgan, Lewis & Bockius LLP

(57) ABSTRACT

A multilayer ceramic capacitor includes a ceramic body including a dielectric layer and having first and second surfaces opposing each other, third and fourth surfaces connecting the first and second surfaces, and fifth and sixth surfaces connected to the first to fourth surfaces and opposing each other, a plurality of internal electrodes disposed inside the ceramic body, exposed through the first and second surfaces, and having one end portion exposed through the third or fourth surface, and first and second side margin portions disposed on the edges of the plurality of internal electrodes, exposed through the first and second surfaces, in which RGB values of the first and second (Continued)

surfaces on which the first and second side margin portions are disposed are different from RGB values of the fifth and sixth surfaces.

29 Claims, 8 Drawing Sheets

(51) Int. Cl.
*H05K 1/18* (2006.01)
*H01G 4/005* (2006.01)

(58) Field of Classification Search
CPC .... H01G 4/30; H01G 4/12; H05K 1/181; H05K 2201/10015
See application file for complete search history.

(56) References Cited

U.S. PATENT DOCUMENTS

| | | | |
|---|---|---|---|
| 9,627,139 | B2 | 4/2017 | Lee et al. |
| 10,886,067 | B2 * | 1/2021 | Lee .................. H01G 4/30 |
| 2006/0158827 | A1 | 7/2006 | Lee et al. |
| 2009/0207554 | A1 | 8/2009 | Iguchi et al. |
| 2012/0147516 | A1 | 6/2012 | Kim et al. |
| 2014/0151102 | A1 | 6/2014 | Lee et al. |
| 2014/0166351 | A1 | 6/2014 | Lee et al. |
| 2014/0177134 | A1 * | 6/2014 | Awata .................. H01G 4/1236 361/321.5 |
| 2014/0285948 | A1 * | 9/2014 | Wada .................. H01G 4/1227 361/301.4 |
| 2014/0301012 | A1 | 10/2014 | Kim |
| 2014/0301013 | A1 | 10/2014 | Kim et al. |
| 2014/0301015 | A1 | 10/2014 | Kim |
| 2015/0122537 | A1 | 5/2015 | Yamada |
| 2015/0200054 | A1 | 7/2015 | Lee et al. |
| 2016/0293332 | A1 | 10/2016 | Keto et al. |
| 2017/0018363 | A1 * | 1/2017 | Tanaka ............... H01G 4/005 |
| 2017/0243697 | A1 | 8/2017 | Mizuno |
| 2018/0108482 | A1 | 4/2018 | Kogure et al. |
| 2018/0218958 | A1 * | 8/2018 | Suga .................. H01G 4/30 |
| 2019/0371528 | A1 * | 12/2019 | Takashima ............ H01G 4/228 |

FOREIGN PATENT DOCUMENTS

| | | |
|---|---|---|
| CN | 103871741 A | 6/2014 |
| CN | 103903856 A | 7/2014 |
| CN | 104103423 A | 10/2014 |
| CN | 104103424 A | 10/2014 |
| CN | 104779052 A | 7/2015 |
| CN | 107958782 A | 4/2018 |
| JP | 2009-200168 A | 9/2009 |
| JP | 2014-204116 A | 10/2014 |
| JP | 2015-111647 A | 6/2015 |
| JP | 2016-162868 A | 9/2016 |
| JP | 2017-118083 A | 6/2017 |
| KR | 10-2010-0136917 A | 12/2010 |
| KR | 10-1141457 B1 | 5/2012 |
| KR | 10-2014-0071043 A | 6/2014 |
| KR | 10-2014-0082929 A | 7/2014 |
| KR | 10-2014-0121725 A | 10/2014 |

OTHER PUBLICATIONS

Notice of Allowance dated Sep. 21, 2020 in U.S. Appl. No. 16/161,807.
Chinese Office Action dated Feb. 7, 2022, issued in corresponding Chinese Patent Application No. 201811465956.3 (with English Translation).
Chinese Office Action dated Sep. 16, 2022, issued in corresponding Chinese Patent Application No. 201811465956.3.
Japanese Office Action dated Aug. 2, 2022, issued in corresponding Japanese Patent Application No. 2018-197062.
Korean Office Action dated Oct. 20, 2022, issued in corresponding Korean Patent Application No. 10-2018-0094925.

* cited by examiner

MULTILAYER CERAMIC CAPACITOR AND METHOD OF MANUFACTURING THE SAME

CROSS-REFERENCE TO RELATED APPLICATION(S)

This application is a continuation of U.S. patent application Ser. No. 16/161,807 filed Oct. 16, 2018 which claims the benefit of priority to Korean Patent Application No. 10-2018-0094925 filed on Aug. 14, 2018 in the Korean Intellectual Property Office, the disclosures of each are incorporated herein by reference in their entirety.

TECHNICAL FIELD

The present disclosure relates to a multilayer ceramic capacitor and a method of manufacturing the same, for adjusting RGB values of a surface of a ceramic body, on which a side margin portion is disposed, and RGB values of a thickness-direction surface of the ceramic body, thereby enhancing reliability.

BACKGROUND

In general, an electronic component using a ceramic material, for example, a capacitor, an inductor, a piezoelectric element, a varistor, or a thermistor, includes a ceramic body formed of a ceramic material, an internal electrode formed in the body, and an external electrode installed on a surface of the ceramic body to be connected to the internal electrode.

In accordance with the recent trend for miniaturized and multifunctional electronic products, a chip component has also been miniaturized and multifunctionalized and, thus, there also has been a need for high-capacity products with a small size and high capacity as a multilayer ceramic capacitor.

To achieve miniaturization and high capacity in a multilayer ceramic capacitor, an electrode effective area needs to be maximized (an effective volume fraction required to embody capacity needs to be increased).

As described above, to embody a miniaturized and high-capacity multilayer ceramic capacitor, a method of exposing the internal electrode in a width direction of the body to maximize an area of the internal electrode in the width direction through a marginless design and separately attaching a side margin portion to the exposed surface of the electrode in the width direction, prior to sintering, after such a chip is manufactured to complete a multilayer ceramic capacitor has been applied when the multilayer ceramic capacitor is manufactured.

When a general multilayer ceramic capacitor is manufactured, a side margin portion at a lateral surface of a body in a width direction and cover portions of upper and lower surfaces of the body in a thickness direction have almost the same dielectric composition and, thus, have similar electrical characteristics.

On the other hand, as described above, to embody a miniaturized and high-capacity multilayer ceramic capacitor, when the side margin portion is separately attached to the exposed surface of the chip in the width direction, a dielectric composition of the side margin portion at the lateral surface of the body in the width direction and a dielectric composition of the cover portions of the upper and lower surfaces of the body in the thickness direction may be differently applied.

With regard to a multilayer ceramic capacitor manufactured by separately attaching the side margin portion to the exposed surface of the electrode in the width direction of the chip, it is general that the thickness of the cover portions of the upper and lower surfaces in the thickness direction of the body is greater than the thickness of the side margin portion at the lateral surface in the width direction.

In this case, electrical characteristics may be changed depending on a direction in which the completely manufactured multilayer ceramic capacitor is installed on a printed circuit board.

That is, when a width-direction lateral surface of a relatively thin body is installed as an installation surface, the multilayer ceramic capacitor is more affected by heat generated by the printed circuit board than when thickness-direction upper and lower surfaces of a relatively thick body are installed as an installation surface.

As such, when a multilayer ceramic capacitor is largely affected by heat generated by a printed circuit board, original electrical characteristic requirements of the multilayer ceramic capacitor are not satisfied, thereby causing failure in a product.

Accordingly, to embody a miniaturized and high-capacity multilayer ceramic capacitor, there has been a need for research to relatively simply and accurately define an installation surface to minimize the influence of heat generated by a printed circuit board with regard to a product in which a side margin portion is separately attached to an exposed surface of an electrode in a width direction of a chip.

SUMMARY

An aspect of the present disclosure may provide a multilayer ceramic capacitor and a method of manufacturing the same, for differently adjusting RGB values of a surface of a ceramic body, on which a side margin portion is disposed, and RGB values of a thickness-direction surface of the ceramic body, thereby enhancing reliability.

According to an aspect of the present disclosure, a multilayer ceramic capacitor may include a ceramic body including a dielectric layer and having first and second surfaces opposing each other in a width direction, third and fourth surfaces connecting the first and second surfaces and opposing each other in a length direction, and fifth and sixth surfaces connected to the first to fourth surfaces and opposing each other in a thickness direction, a plurality of internal electrodes disposed inside the ceramic body, exposed through the first and second surfaces, and having one end portion exposed through the third or fourth surface, and a first side margin portion and a second side margin portion disposed on the first and second surfaces, through which edges of the plurality of internal electrodes are exposed. RGB values of the first and second surfaces on which the first and second side margin portions are disposed are different from RGB values of the fifth and sixth surfaces which are in parallel with planar surfaces of the plurality of internal electrodes.

According to another aspect of the present disclosure, a method of manufacturing a multilayer ceramic capacitor may include preparing a first ceramic green sheet on which a plurality of first internal electrode patterns are disposed at a predetermined interval and a second ceramic green sheet on which a plurality of second internal electrode patterns are disposed at a predetermined interval, forming a ceramic green sheet stack body by stacking the first and second ceramic green sheets in such a manner that the plurality of first and second internal electrode patterns overlap each other in a stacking direction, cutting the ceramic green sheet stack body in a width direction to have a lateral surface through which ends of the plurality of first and second internal electrode patterns are exposed, forming a first side margin portion and a second side margin portion on the lateral surface through which the ends of the plurality of first and second internal electrode patterns are exposed, and preparing a ceramic body including a dielectric layer and a plurality of internal electrodes by sintering the cut stack body. The ceramic body includes first and second surfaces opposing each other in the width direction, third and fourth surfaces connecting the first and second surfaces opposing each other in a length direction, and fifth and sixth surfaces connected to the first to fourth surfaces and opposing each other in the stacking direction, the first and second side margin portions are disposed on the first and second surfaces, through which edges of the plurality of internal electrodes are exposed, and RGB values of the first and second surfaces on which the first and second side margin portions are disposed are different from RGB values of the fifth and sixth surfaces which are in parallel with planar surfaces of the plurality of internal electrodes.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
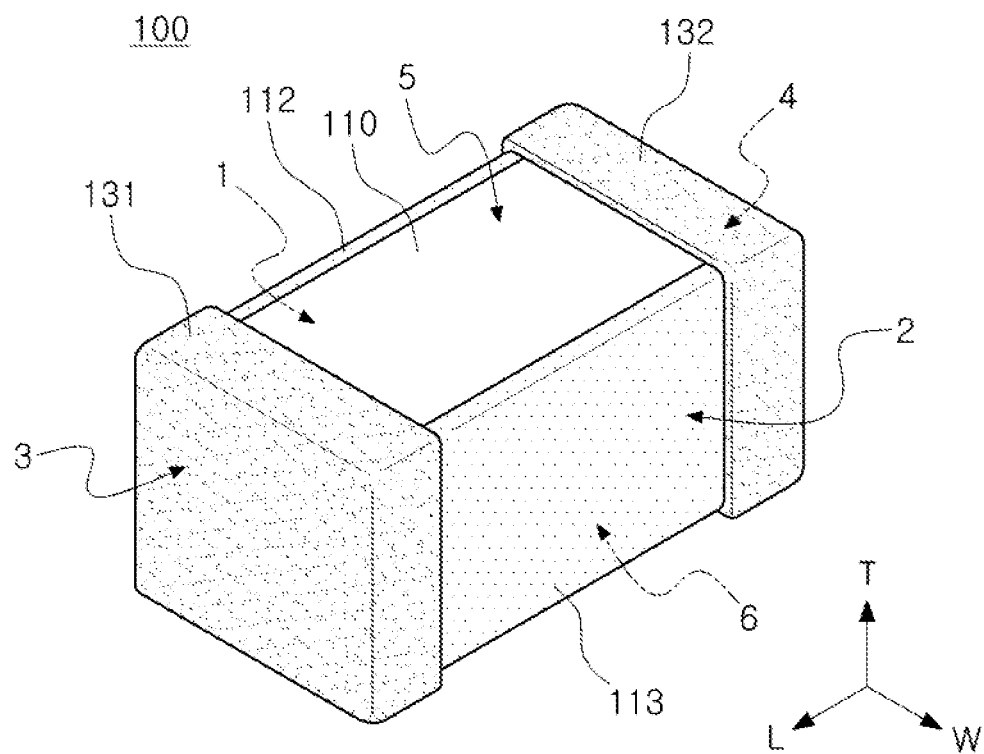
FIG. 1 is a schematic perspective view of a multilayer ceramic capacitor according to an exemplary embodiment of the present disclosure.

FIG. 1 is a schematic perspective view of a multilayer ceramic capacitor according to an exemplary embodiment of the present disclosure.

Figure 2:
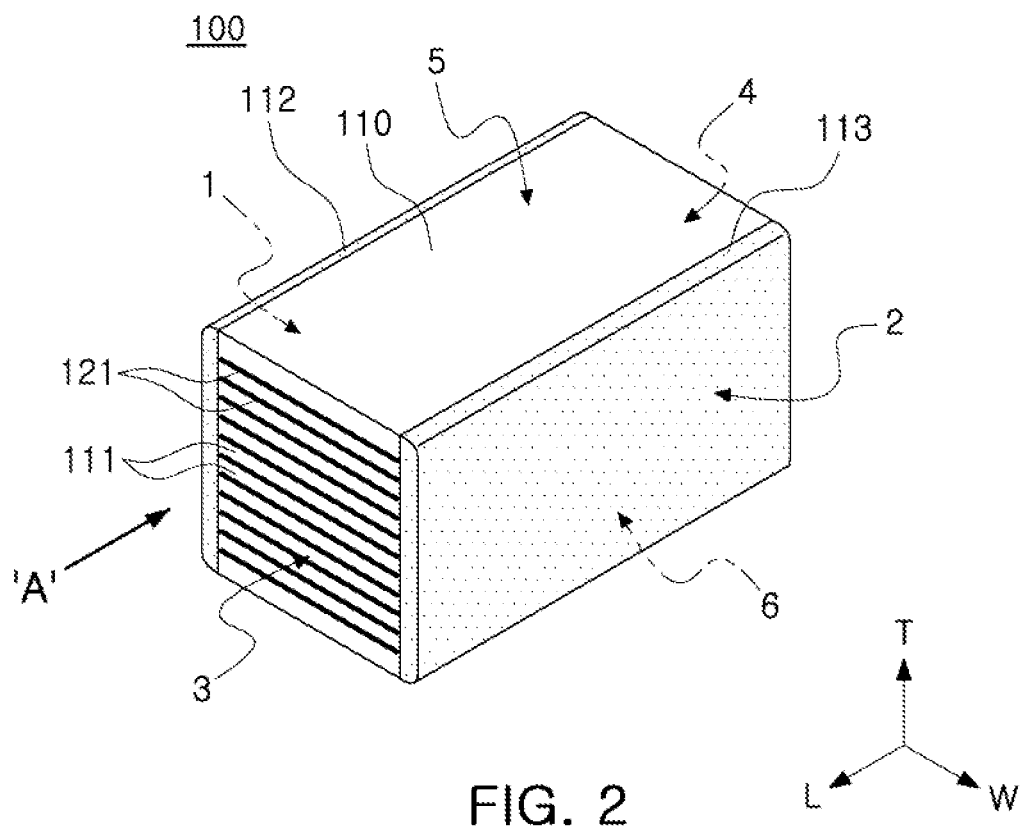
FIG. 2 is a perspective view showing an outer appearance of the ceramic body of FIG. 1.

FIG. 2 is a perspective view showing an outer appearance of the ceramic body of FIG. 1.

Figure 3:
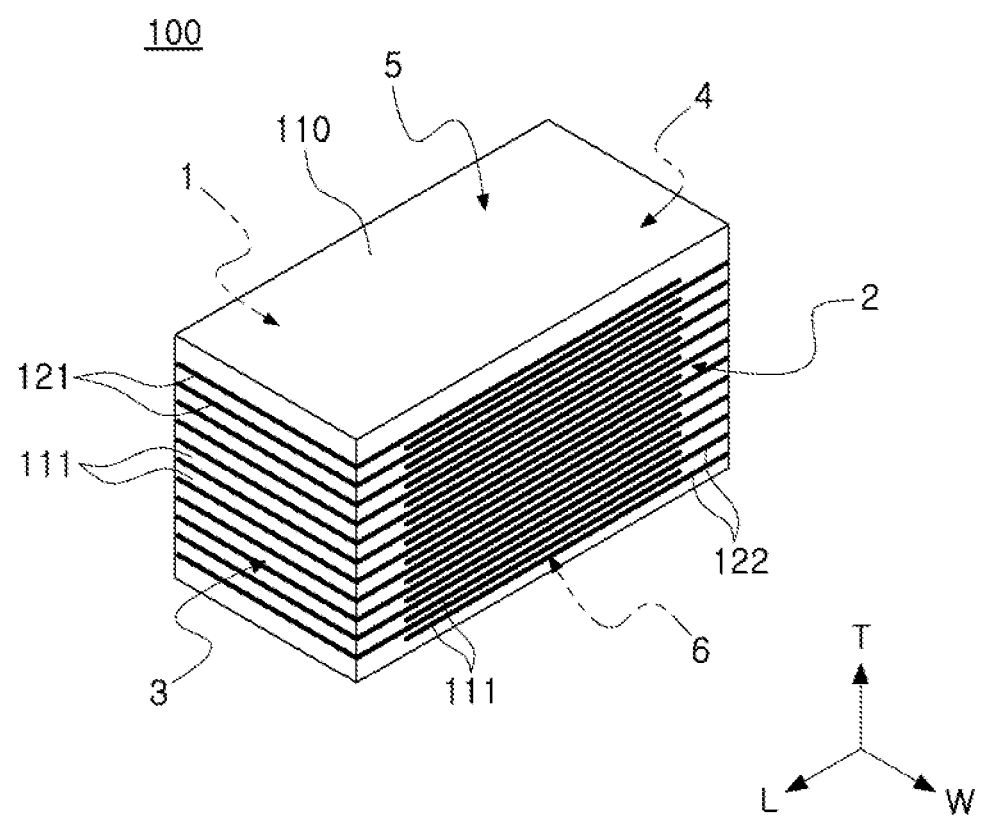
FIG. 3 is a perspective view showing a ceramic green sheet stack body before the ceramic body of FIG. 2 is sintered.

FIG. 3 is a perspective view showing a ceramic green sheet stack body before the ceramic body of FIG. 2 is sintered.

Figure 4:
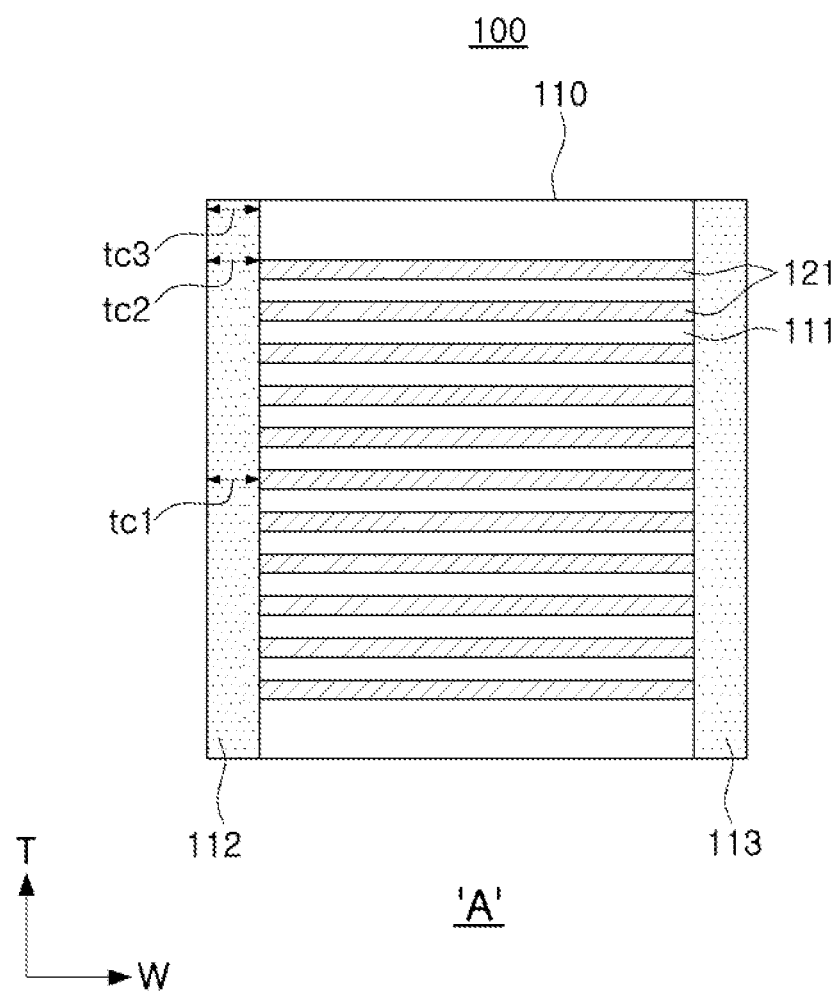
FIG. 4 is a lateral view viewed in a direction A of FIG. 2.

FIG. 4 is a lateral view viewed in a direction A of FIG. 2.

Referring to FIGS. 1 to 4, a multilayer ceramic capacitor 100 according to the present exemplary embodiment may include a ceramic body 110, a plurality of internal electrodes 121 and 122 formed inside the ceramic body 110, and external electrodes 131 and 132 formed on an external surface of the ceramic body 110.

The ceramic body 110 may have a first surface 1 and a second surface 2, which face each other, a third surface 3 and a fourth surface 4, which connect the first and second surfaces, and a fifth surface 5 and a sixth surface 6 which are upper and lower surfaces, respectively.

The first surface 1 and the second surface 2 may be defined as surfaces that face each other in a width direction of the ceramic body 110, the third surface 3 and the fourth surface 4 may be defined as surfaces that face each other in a length direction, and the fifth surface 5 and the sixth surface 6 may be defined as surfaces that face each other in a thickness direction.

A shape of the ceramic body 110 is not particularly limited but may be a rectangular parallelepiped shape as shown in the drawing.

One end portion of each of the plurality of internal electrodes 121 and 122 formed inside the ceramic body 110 may be exposed through the third surface 3 or the fourth surface 4 of the ceramic body 110.

The internal electrodes 121 and 122 may include a first internal electrode 121 and a second internal electrode 122 as a pair of electrodes with different polarities.

One end portion of the first internal electrode 121 may be exposed through the third surface 3 and one end portion of the second internal electrode 122 may be exposed through the fourth surface 4.

The other end portion of each of the first internal electrode 121 and the second internal electrode 122 may be spaced apart from the third surface 3 or the fourth surface 4 by a predetermined interval.

First and second external electrodes 131 and 132 may be formed on the third surface 3 and the fourth surface 4 of the ceramic body 110 and may be electrically connected to the internal electrode 121 and 122.

According to an exemplary embodiment of the present disclosure, the multilayer ceramic capacitor 100 may include the plurality of internal electrodes 121 and 122 that are disposed inside the ceramic body 110, are exposed through the first and second surfaces 1 and 2, and have one end portion exposed through the third surface 3 or the fourth surface 4, and a first side margin portion 112 and a second side margin portion 113 that are disposed on one edges of the plurality of internal electrodes 121 and 122 exposed through the first surface 1 and the second surface 2.

The plurality of internal electrodes 121 and 122 may be formed inside the ceramic body 110, each end of the plurality of internal electrodes 121 and 122 may be exposed through the first surface 1 and the second surface 2 that are surfaces in a width direction of the ceramic body 110, and the first side margin portion 112 and the second side margin portion 113 may be disposed on the exposed end portion.

An average thickness of the first side margin portion 112 and the second side margin portion 113 may be between 2 μm and 10 μm.

According to an exemplary embodiment of the present disclosure, the ceramic body 110 may include a stack structure in which a plurality of dielectric layers 111 is stacked, and the first side margin portion 112 and the second side margin portion 113 that are disposed on opposite lateral surfaces of the stack structure.

The plurality of dielectric layers 111 may be in a sintered state and may be integrated into each other in such a manner that a boundary between adjacent dielectric layers is not recognizable.

A length of the ceramic body 110 may correspond to a distance to the fourth surface 4 from the third surface 3 of the ceramic body 110.

A length of the dielectric layer 111 may form a distance between the third surface 3 and the fourth surface 4 of the ceramic body 110.

According to an exemplary embodiment of the present disclosure a length of the ceramic body may be, but is not limited to, 400 to 1400 μm. In more detail, the length of the ceramic body may be 400 to 800 μm or 600 to 1400 μm.

The internal electrodes 121 and 122 may be formed on the dielectric layer 111 and the internal electrodes 121 and 122 may be formed by being sintered inside the ceramic body 110 across one dielectric layer 111.

Referring to FIG. 3, the first internal electrode 121 may be formed on the dielectric layer 111. The first internal electrode 121 may not be entirely formed in a length direction of a dielectric layer. That is, one end portion of the first internal electrode 121 may be spaced apart from the fourth surface 4 of the ceramic body 110 by a predetermined interval, and the other end portion of the first internal electrode 121 may be formed up to the third surface 3 to be exposed through the third surface 3.

One end portion of the first internal electrode 121 exposed through the third surface 3 of the ceramic body 110 may be connected to the first external electrode 131.

Oppositely from the first internal electrode 121, one end portion of the second internal electrode 122 may be spaced apart from the third surface 3 by a predetermined interval and the other end of the second internal electrode 122 may be exposed through the fourth surface 4 to be connected to the second external electrode 132.

To embody a high-capacity multilayer ceramic capacitor, the internal electrode may be formed by stacking 400 or more layers but is not limited thereto.

The dielectric layer 111 may have the same width as a width of the first internal electrode 121. That is, the first internal electrode 121 may be entirely formed in a width direction of the dielectric layer 111.

According to an exemplary embodiment of the present disclosure, a width of a dielectric layer and a width of an internal electrode may be, but are not limited to, 100 to 900 μm. In more detail, the width of the dielectric layer and the width of the internal electrode may be 100 to 500 μm or 100 to 900 μm.

As a ceramic body is miniaturized, a thickness of a side margin portion may affect the electrical characteristics of a multilayer ceramic capacitor. According to an exemplary embodiment of the present disclosure, the thickness of the side margin portion may be formed with 10 μm or less to enhance the characteristics of a miniaturized multilayer ceramic capacitor.

That is, the side margin portion may be formed with a thickness equal to or less than 10 μm and, thus, an area in which internal electrodes overleap with each other to form capacity, thereby embodying a high-capacity and miniaturized multilayer ceramic capacitor.

The ceramic body 110 may include an active portion that facilitates formation of capacity of a capacitor, and upper and lower cover portions that are respectively formed on upper and lower portions of the active portion as upper and lower margin portions.

The active portion may be formed by repeatedly stacking the plurality of first and second internal electrodes 121 and 122 across the dielectric layer 111.

The upper and lower cover portions may have the same material and configuration as the dielectric layer 111 except that the upper and lower cover portions do not include an internal electrode.

That is, the upper and lower cover portions may include a ceramic material and, for example, may include a barium titanate ($BaTiO_3$)-based ceramic material.

The upper and lower cover portions may each have a thickness equal to or less than 20 μm but are not limited thereto.

According to an exemplary embodiment of the present disclosure, the internal electrode and the dielectric layer may be simultaneously cut and formed and the internal electrode may be formed with the same width as a width of the dielectric layer, which is described below in more detail.

According to the present exemplary embodiment, the dielectric layer may be formed with the same width as a width of the internal electrode and, thus, an end of the plurality of internal electrodes 121 and 122 may be exposed through first and second surfaces in a width direction of the ceramic body 110.

The first side margin portion 112 and the second side margin portion 113 may be formed on opposite lateral surfaces in the width direction of the ceramic body 110, through which the ends of the plurality of internal electrodes 121 and 122 are exposed.

The first side margin portion 112 and the second side margin portion 113 may each have a thickness equal to or less than 10 μm. As a thickness of each of the first side margin portion 112 and the second side margin portion 113 is reduced, an area by which internal electrodes formed in the ceramic body 110 overlap with each other may be relatively increased.

The thickness of each of the first side margin portion 112 and the second side margin portion 113 is not particularly limited as long as short circuits of the internal electrode exposed through the lateral surface of the ceramic body 110 is prevented and, for example, the first side margin portion 112 and the second side margin portion 113 may have a thickness equal to or greater than 2 μm.

When the first and second side margin portions have a thickness less than 2 μm, there may be a worry about degraded mechanical strength with respect to external shocks and, when the first and second side margin portions have a thickness greater than 10 μm, an overlapping area of the plurality of internal electrodes may be reduced and it may be difficult to high capacity of a multilayer ceramic capacitor.

To maximize capacity of the multilayer ceramic capacitor, a method of thinning a dielectric layer, a method of stacking a multilayer thinned dielectric layer, a method of enhancing coverage of an internal electrode, or the like has been considered.

In addition, a method of enhancing an overlapping area of internal electrodes forming capacity has been considered.

To increase the overlapping area of the plurality of internal electrodes, a region of a margin portion, on which an internal electrode is not formed, needs to be minimized.

In particular, to increase the overlapping area of the plurality of internal electrodes as a multilayer ceramic capacitor is miniaturized, a region of the margin portion needs to be minimized.

According to the present exemplary embodiment, the internal electrode may be formed an entire width-direction area of the dielectric layer and a thickness of the side margin portion may be set to be equal to or less than 10 μm to increase the overlapping area of the internal electrode.

In general, as a dielectric layer is configured as a multilayer, a thickness of the dielectric layer and the internal electrode may be reduced. Accordingly, the internal electrode may be frequently short-circuited. When the internal electrode is formed only in a portion of the dielectric layer, a step different may be generated due to the internal electrode to reduce an accelerated lifetime or reliability.

However, according to the present exemplary embodiment, even if a thinned internal electrode and dielectric layer are formed, the internal electrode may be formed on an entire width-direction portion of the dielectric layer and, thus, the overlapping area of the internal electrode may be increased to increase capacity of the multilayer ceramic capacitor.

The step difference due to the internal electrode may be reduced to enhance an accelerated lifetime to provide a multilayer ceramic capacitor with excellent reliability as well as excellent capacity characteristics.

According to an exemplary embodiment of the present disclosure, RGB values of the first surface 1 and the second surface 2 on which the first side margin portion 112 and the second side margin portion 113 are disposed and RGB values of the fifth surface 5 and the sixth surface 6 may be different.

As described above, the fifth surface 5 and the sixth surface 6 of the ceramic body 110 may face each other in a thickness direction and may correspond to surfaces in a length-width (LW) direction of the ceramic body 110.

The fifth surface 5 and the sixth surface 6 of the ceramic body 110 may correspond to surfaces positioned in parallel to a stack direction of the dielectric layer 111 and the plurality of internal electrodes 121 and 122.

As described above, the first surface 1 and the second surface 2 on which the first side margin portion 112 and the second side margin portion 113 are disposed may face each other in a width direction of the ceramic body 110 and may correspond to surfaces in a length-thickness (LT) direction of the ceramic body 110.

The first surface 1 and the second surface 2 on which the first side margin portion 112 and the second side margin portion 113 are disposed may correspond to surfaces perpendicular to a stack direction of the dielectric layer 111 and the plurality of internal electrodes 121 and 122.

In general, with regard to a multilayer ceramic capacitor manufactured by separately attaching a side margin portion to an exposed surface of an electrode in the width direction of a chip, a thickness of a cover portion of upper and lower surfaces in a thickness direction of a ceramic body may be greater than a thickness of a side margin portion of lateral surfaces in a width direction.

In this case, electrical characteristics may be changed depending on a direction in which a completely manufactured multilayer ceramic capacitor is installed on a printed circuit board.

That is, when a width-direction lateral surface of a relatively thin ceramic body is installed as an installation surface, the multilayer ceramic capacitor is more largely affected by heat generated by the printed circuit board than when thickness-direction upper and lower surfaces of a relatively thick ceramic body are installed as an installation surface.

As such, when a multilayer ceramic capacitor is largely affected by heat generated by a printed circuit board, original electrical characteristic requirements of the multilayer ceramic capacitor are not satisfied, thereby causing failure in a product.

Accordingly, to embody a miniaturized and high-capacity multilayer ceramic capacitor, there is a need for a method of simply and accurately defining an installation surface to minimize influence of heat generated by a printed circuit board with regard to a product in which a side margin portion is separately attached to an exposed surface of an electrode in a width direction of a chip.

According to an exemplary embodiment of the present disclosure, RGB values of the first surface 1 and the second surface 2 on which the first side margin portion 112 and the second side margin portion 113 are disposed and RGB values of the fifth surface 5 and the sixth surface 6 of the ceramic body 110 may be different from each other and, thus, an installation surface of the multilayer ceramic capacitor 100 installed on a printed circuit board may be simply and accurately defined.

That is, as described above, according to an exemplary embodiment of the present disclosure, when a width-direction lateral surface of a relatively thin ceramic body is installed as an installation surface to install the multilayer ceramic capacitor on the printed circuit board, the multilayer ceramic capacitor may be largely affected by heat generated by the printed circuit board, thereby degrading electrical characteristics.

Accordingly, as described above, the RGB values of the first surface 1 and the second surface 2 on which the first side margin portion 112 and the second side margin portion 113 are disposed and the RGB values of the fifth surface 5 and the sixth surface 6 may be different from each other and, thus, an installation surface installed on the printed circuit board may be differentiated as the fifth surface 5 and the sixth surface 6 of the ceramic body 110 during a taping process.

When the taping process is performed using the fifth surface 5 and the sixth surface 6 of the ceramic body 110 as an installation surface, if the multilayer ceramic capacitor 100 according to an exemplary embodiment of the present disclosure is actually installed on the printed circuit board, a surface on which the dielectric layer 111 and the plurality of internal electrodes 121 and 122 are stacked may be positioned in parallel to an upper surface of the printed circuit board.

That is, according to an exemplary embodiment of the present disclosure, the first surface 1 and the second surface 2 on which the first side margin portion 112 and the second side margin portion 113 are disposed may be used as an installation surface and, thus, the surface on which the dielectric layer 111 and the plurality of internal electrodes 121 and 122 are stacked may be prevented from being positioned perpendicularly to an upper surface of the printed circuit board.

According to an exemplary embodiment of the present disclosure, the first surface 1 and the second surface 2 on which the first side margin portion 112 and the second side margin portion 113 with a relatively small thickness are disposed may not be used as an installation surface during installation on the printed circuit board, thereby preventing reliability from being degraded due to influence of heat generated by the printed circuit board.

According to an exemplary embodiment of the present disclosure, RGB values of the first surface 1 and the second surface 2 on which the first side margin portion 112 and the second side margin portion 113 are disposed may be greater than RGB values of the fifth surface 5 and the sixth surface 6 of the ceramic body 110.

The RGB values of the first surface 1 and the second surface 2 on which the first side margin portion 112 and the second side margin portion 113 are disposed is greater than the RGB values of the fifth surface 5 and the sixth surface 6 of the ceramic body 110 and, thus, an installation surface installed on the printed circuit board may be differentiated as the fifth surface 5 and the sixth surface 6 of the ceramic body 110 during a taping process.

An RGB difference between the first surface 1 and the second surface 2 on which the first side margin portion 112 and the second side margin portion 113 are disposed and the fifth surface 5 and the sixth surface 6 of the ceramic body 110 may be 20 to 40.

An RGB difference between the first surface 1 and the second surface 2 on which the first side margin portion 112 and the second side margin portion 113 are disposed and the fifth surface 5 and the sixth surface 6 of the ceramic body 110 may be a maximum of 30 to 40.

That is, according to an exemplary embodiment of the present disclosure, RGB values of the first surface 1 and the second surface 2 on which the first side margin portion 112 and the second side margin portion 113 are disposed may have a greater value than RGB values of the fifth surface 5 and the sixth surface 6 of the ceramic body 110 by 20 to 40 and may have a greater value than the RGB values of the fifth surface 5 and the sixth surface 6 of the ceramic body 110 by a maximum of 30 to 40.

For example, according to an exemplary embodiment of the present disclosure, a measured R value of the first surface 1 and the second surface 2 on which the first side margin portion 112 and the second side margin portion 113 are disposed may be greater than an R value of the fifth surface 5 and the sixth surface 6 of the ceramic body 110 by 34.

According to an exemplary embodiment of the present disclosure, a measured G value of the first surface 1 and the second surface 2 on which the first side margin portion 112 and the second side margin portion 113 are disposed may be greater than a G value of the fifth surface 5 and the sixth surface 6 of the ceramic body 110 by 26.

In addition, according to an exemplary embodiment of the present disclosure, a B value of the first surface 1 and the second surface 2 on which the first side margin portion 112 and the second side margin portion 113 are disposed may be greater than a B value of the fifth surface 5 and the sixth surface 6 of the ceramic body 110 by 30.

According to an exemplary embodiment of the present disclosure, a miniaturized and high-capacity multilayer ceramic capacitor may be configured in such a manner that the dielectric layer 111 has a thickness equal to or less than 0.4 μm and the internal electrodes 121 and 122 have a thickness equal to or less than 0.4 μm.

According to an exemplary embodiment of the present disclosure, in the case of a miniaturized and high-capacity multilayer ceramic capacitor using a thinned dielectric layer and internal electrode, that is, the dielectric layer 111 with a thickness equal to or less than 0.4 μm and the internal electrodes 121 and 122 with a thickness equal to or less than 0.4 μm, a problem in terms of reliability due to a difference in an installation surface may be a very important issue.

That is, in the case of a conventional multilayer ceramic capacitor, a thickness of a cover portion of thickness-direction upper and lower surfaces of the ceramic body is not much different from a thickness of a side margin portion of a width-direction lateral surface and, thus, when thickness-direction upper and lower surfaces of the ceramic body are used as an installation surface and a width-direction lateral surface is used as an installation surface, degradation in electrical characteristics due to heat generated by a printed circuit board may not be much problematic.

However, in the case of a miniaturized and high-capacity multilayer ceramic capacitor manufactured by attaching a separate side margin portion according to an exemplary embodiment of the present disclosure, the side margin portion may be formed with a smaller thickness than a thickness of the cover portion and, thus, there may be a problem in terms of degradation in electrical characteristics due to heat generated by a printed circuit board depending on an installation direction.

That is, according to an exemplary embodiment of the present disclosure, the RGB values of the first surface 1 and the second surface 2 on which the first side margin portion 112 and the second side margin portion 113 are disposed may be adjusted to be greater than the RGB values of the fifth surface 5 and the sixth surface 6 of the ceramic body 110 and, thus, an installation surface installed on the printed circuit board may be simply and accurately differentiated to enhance reliability in the case of a thin film in which the dielectric layer 111 and the first and second internal electrodes 121 and 122 have a thickness equal to or less than 0.4 μm.

However, the thin film may not refer to the case in which the dielectric layer 111 and the first and second internal electrodes 121 and 122 have a thickness equal to or less than 0.4 μm and may be interpreted as a concept including a dielectric layer and internal electrode with a smaller thickness than a conventional product.

In reality, as seen from a measurement result of an experiment, the first surface 1 and the second surface 2 on which the first side margin portion 112 and the second side margin portion 113 are disposed may be used as an installation surface and, thus, when a surface on which the dielectric layer 111 and the plurality of internal electrodes 121 and 122 are stacked is positioned perpendicularly to the upper surface of the printed circuit board and, failure of 95% or more may be caused.

Referring to FIG. 4, a ratio of a thickness tc2 of a region of the first or second side margin portion, which contacts edges of the plurality of internal electrodes disposed as the outermost portion, to a thickness tc1 of a region of the first or second side margin portion, which contacts edges of the plurality of internal electrodes disposed in a central portion of the plurality of internal electrodes 121 and 122, may be equal to or less than 1.0.

A lower limit of the ratio of the thickness tc2 of a region of the first or second side margin portion, which contacts edges of the plurality of internal electrodes disposed as the outermost portion, to the thickness tc1 of a region of the first or second side margin portion, which contacts edges of the plurality of internal electrodes disposed in a central portion, is not particularly limited but may be equal to or greater than 0.9.

According to an exemplary embodiment of the present disclosure, unlike the prior art, the first or second side margin portion is formed by attaching a ceramic green sheet to a lateral surface of a ceramic body and, thus, a thickness for each position of the first or second side margin portion may be constant.

That is, a conventionally, a side margin portion is formed by coating or printing ceramic slurry and, thus, a deviation in the side margin portion for each position is serious.

In detail, conventionally, a thickness of a region of the first or second margin portion, which contacts edges of the plurality of internal electrodes disposed in a central portion of a ceramic body, may be greater than a thickness of the other region.

For example, conventionally, a ratio of a thickness of a region of the first or second margin portion, which contacts edges of the plurality of internal electrodes disposed as the outermost portion, to the thickness of a region of the first or second margin portion, which contacts edges of the plurality of internal electrodes disposed in the central portion may be less than 0.9 and, thus, a deviation between the thicknesses is high.

As such, in the conventional case in which a deviation in a thickness of a side margin portion for each position is high, a multilayer ceramic capacitor with a constant size has a large portion occupied by the side margin portion and, thus, it is not possible to ensure a large size of a capacity formation portion and it is difficult to ensure high capacity.

On the other hand, according to an exemplary embodiment of the present disclosure, an average thickness of the first and second side margin portions 112 and 113 is between 2 μm and 10 μm and a ratio of the thickness tc2 of the region of the first or second side margin portion, which contacts edges of the plurality of internal electrodes disposed as the outermost portion, to a thickness tc1 of a region of the first or second side margin portion, which contacts edges of the plurality of internal electrodes disposed in a central portion of the plurality of internal electrodes 121 and 122, is between 0.9 and 1.0 and, thus, the side margin portion may have a small thickness and a low thickness deviation to ensure a large size of a capacity formation portion.

According to an exemplary embodiment of the present disclosure, a ceramic green sheet may be attached to a lateral surface of a ceramic body and, thus, a thickness of the first or second side margin portion for each position may be constant, differently from the conventional case.

Accordingly, it may be possible to embody a high-capacity multilayer ceramic capacitor.

Referring to FIG. 4, a ratio of a thickness tc3 of a region of the first or second side margin portion, which contacts an edge of the ceramic body 110, to the thickness tc1 of a region of the first or second side margin portion, which contacts edges of the plurality of internal electrodes disposed in a central portion of the plurality of internal electrodes 121 and 122, may be equal to or less than 1.0.

A lower limit of the ratio of thickness tc3 of a region of the first or second side margin portion, which contacts the edge of the ceramic body 110, to the thickness tc1 of a region of the first or second side margin portion, which contacts edges of the plurality of internal electrodes disposed in a central portion, may be equal to or greater than 0.9.

According to the above characteristics, a large size of a capacity formation portion may be ensured due to a small thickness deviation of the side margin portion for each region and, thus, it may be possible to embody a high-capacity multilayer ceramic capacitor.

FIGS. 5A to 5F are schematic cross-sectional views of a method of manufacturing a multilayer ceramic capacitor according to another exemplary embodiment of the present disclosure.

Another exemplary embodiment of the present disclosure may provide a method of manufacturing a multilayer ceramic capacitor, including preparing a first ceramic green sheet on which a plurality of first internal electrode patterns are formed at a predetermined interval and a second ceramic green sheet on which a plurality of second internal electrode patterns are formed at a predetermined interval, forming a ceramic green sheet stack body by stacking the first and second ceramic green sheets in such a manner that the first and second internal electrode patterns intersect each other, cutting the ceramic green sheet stack body to have a lateral surface through which an end of the first and second internal electrode patterns is exposed in a width direction, forming a first side margin portion and a second side margin portion on the lateral surface through which the end of the first and second internal electrode patterns is exposed, and preparing a ceramic body including a dielectric layer and first and second internal electrodes by sintering the cut stack body and, in this case, the first and second side margin portions are divided into a first region adjacent to a boundary surface of the ceramic body and a second region adjacent to the first and second internal electrodes and content of magnesium (Mg) included in the second region is greater than content of magnesium (Mg) included in the first region.

Hereinafter, a method of manufacturing a multilayer ceramic capacitor according to another exemplary embodiment of the present disclosure is described.

Figure 5A:
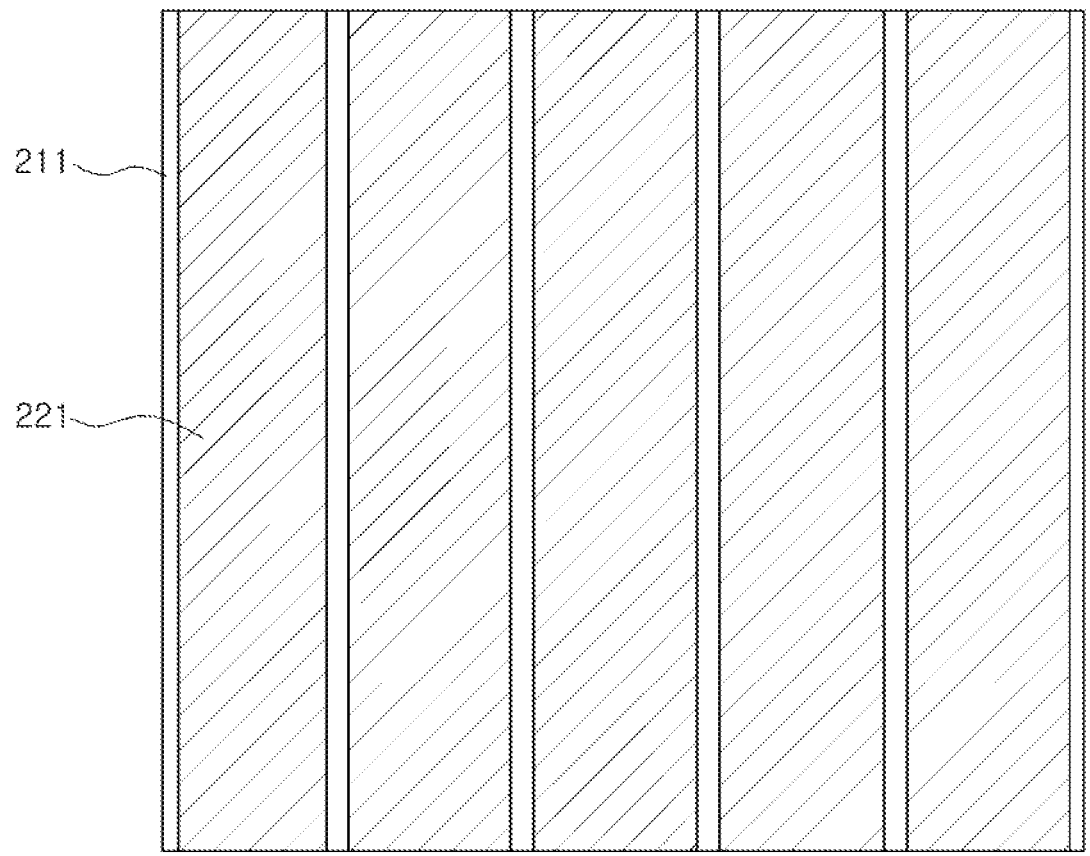
FIGS. 5A to 5F are schematic cross-sectional views of a method of manufacturing a multilayer ceramic capacitor according to another exemplary embodiment of the present disclosure.

As shown in FIG. 5A, a plurality of stripe-type first internal electrode patterns 221 may be formed on a ceramic green sheet 211 at a predetermined interval. The plurality of stripe-type first internal electrode patterns 221 may be formed in parallel to each other.

The ceramic green sheet 211 may be formed of a ceramic paste including a ceramic powder, an organic solvent, and an organic binder.

The ceramic powder may be a material with a high dielectric constant but may be, but is not limited to, a barium titanate ($BaTiO_3$)-based material, a lead perovskite-based material, a strontium titanate ($SrTiO_3$)-based material, or the like and, for example, may be a barium titanate ($BaTiO_3$) powder. The ceramic green sheet 211 is sintered to form the dielectric layer 111 configuring the ceramic body 110.

The stripe-type first internal electrode pattern 221 may be formed of an internal paste including conductive metal. The conductive metal may be, but is not limited to, nickel (Ni), copper (Cu), palladium (Pd), or an alloy thereof.

A method of forming the stripe-type first internal electrode pattern 221 on the ceramic green sheet 211 may not be particularly limited but, for example, may be a printing method such as a screen printing method or a gravia printing method.

Although not illustrated, a plurality of stripe-type second internal electrode patterns 222 may be formed on another ceramic green sheet 211 at a predetermined interval.

Hereinafter, a ceramic green sheet on which the first internal electrode pattern 221 is formed may be referred to as a first ceramic green sheet and a ceramic green sheet on which the second internal electrode pattern 222 may be referred to as a second ceramic green sheet.

Figure 5B:
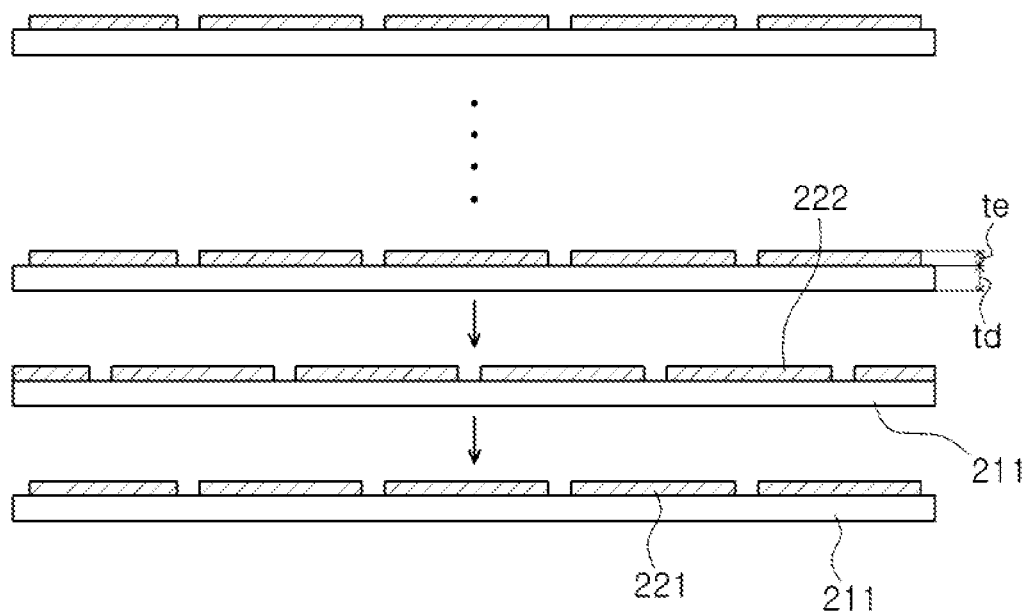

Then, s shown in FIG. 5B, first and second ceramic green sheets may be alternately stacked in such a manner that the stripe-type first internal electrode pattern 221 and the stripe-type second internal electrode pattern 222 are stacked to intersect each other.

Then, the stripe-type first internal electrode pattern 221 may become the first internal electrode 121 and the stripe-type second internal electrode pattern 222 may be the second internal electrode 122.

According to another exemplary embodiment of the present disclosure, the first and second ceramic green sheets may have a thickness td equal to or less than 0.6 μm and the first and second internal electrode patterns may have a thickness to equal to or less than 0.5 μm.

The present disclosure relates to a miniaturized and high-capacity multilayer ceramic capacitor including a thin film that includes a dielectric layer with a thickness equal to or less than 0.4 μm and an internal electrode with a thickness equal to or less than 0.4 μm and, thus, the first and second ceramic green sheets may have a thickness td equal to or less than 0.6 μm and the first and second internal electrode patterns may have a thickness to equal to or less than 0.5 μm.

Figure 5C:
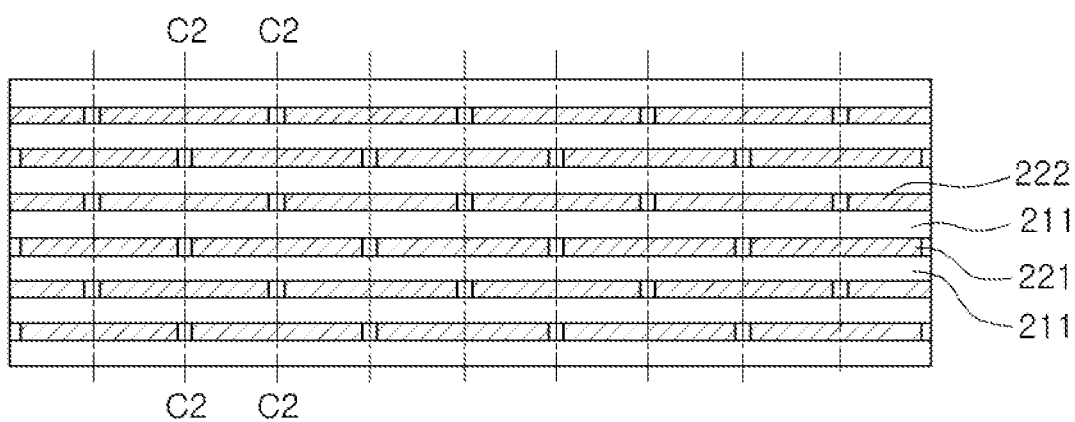
Figure 5D:
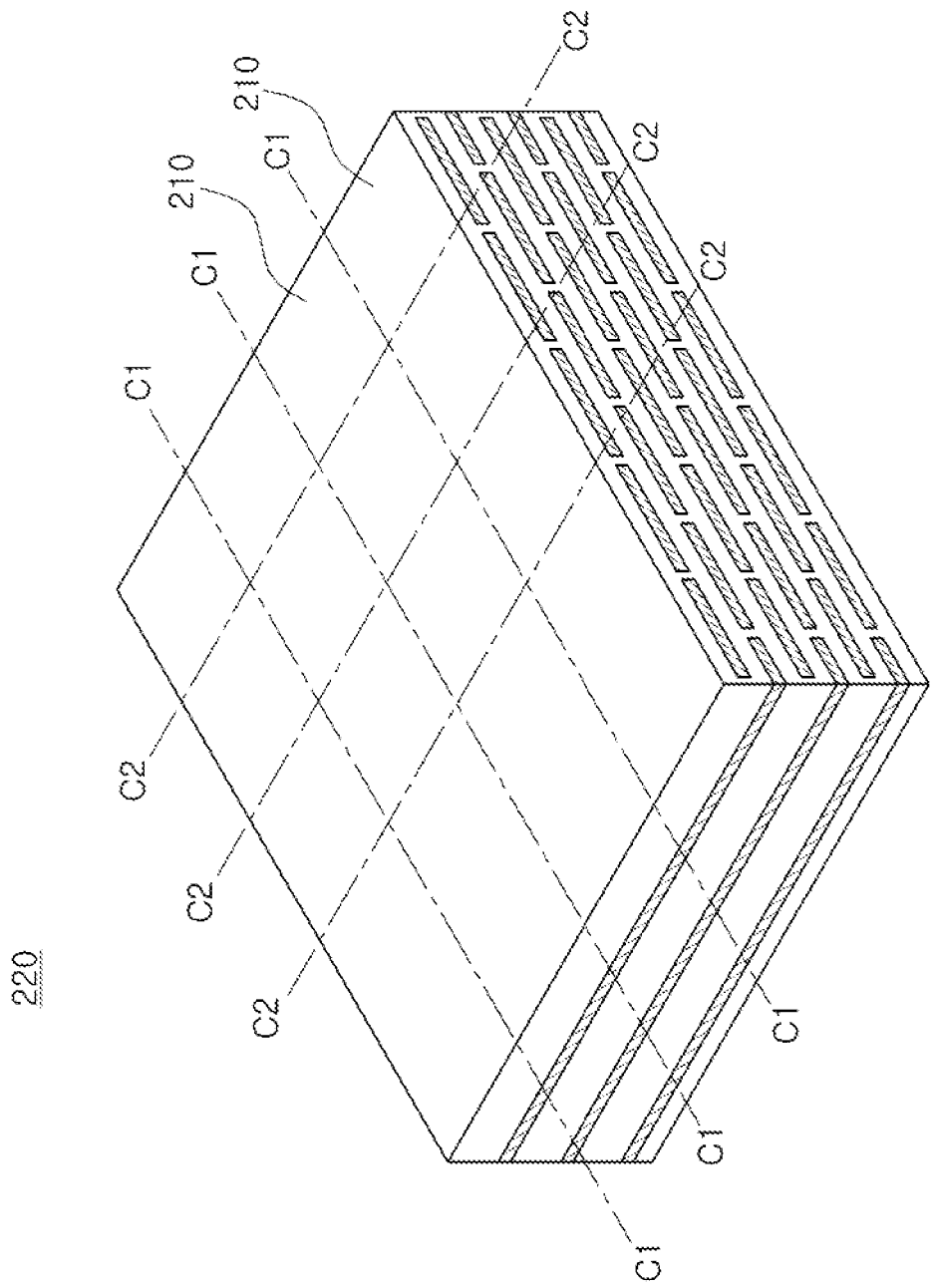

FIG. 5C is a cross-sectional view of a ceramic green sheet stack body 220 in which first and second ceramic green sheets are stacked according to an exemplary embodiment of the present disclosure. FIG. 5D is a perspective view of the ceramic green sheet stack body 220 in which first and second ceramic green sheets are stacked.

Referring to FIGS. 5C and 5D, the first ceramic green sheet on which the plurality of stripe-type first internal electrode patterns 221 formed in parallel to each other are printed and the second ceramic green sheet on which the plurality of stripe-type second internal electrode pattern 222 formed in parallel to each other are printed may be alternately stacked.

In more detail, the first and second ceramic green sheets may be stacked in such a manner that intervals between central portions of the stripe-type first internal electrode patterns 221 printed on the first ceramic green sheet and the stripe-type second internal electrode patterns 222 printed on the second ceramic green sheet overlap with each other.

Then, as shown in FIG. 5D, the ceramic green sheet stack body 220 may be cut to intersect the plurality of stripe-type first internal electrode patterns 221 and the plurality of stripe-type second internal electrode patterns 222. That is, the ceramic green sheet stack body 220 may become stack bodies 210 formed by cutting the ceramic green sheet stack body 220 along cutting lines C1-C1 and C2-C2 that are perpendicular to each other.

In more detail, the stripe-type first internal electrode pattern 221 and the stripe-type second internal electrode pattern 222 may be cut in a length direction to be divided into a plurality of internal electrodes with a constant width. In this case, the stacked ceramic green sheets may also be cut along with the internal electrode patterns. Accordingly, the dielectric layer may be formed with the same width as a width of the internal electrode.

The ceramic green sheet stack body 220 may be cut along the cutting line C2-C2 depending on a size of a separate ceramic body. That is, the plurality of stack bodies 210 may be formed by cutting a bar-type stack structure along the cutting line C2-C2 with a ceramic body size before the first side margin portion and the second side margin portion are formed.

That is, the bar-type stack structure may be cut to cut overlapping predetermined intervals formed between the central portions of the first internal electrodes and the second internal electrode along the same cutting line. Accordingly, one end portions of the first internal electrode and the second internal electrode may be alternately exposed through the cut surface.

Then, the first side margin portion and the second side margin portion may be formed on the first and second lateral surfaces of the stack bodies 210.

Figure 5E:
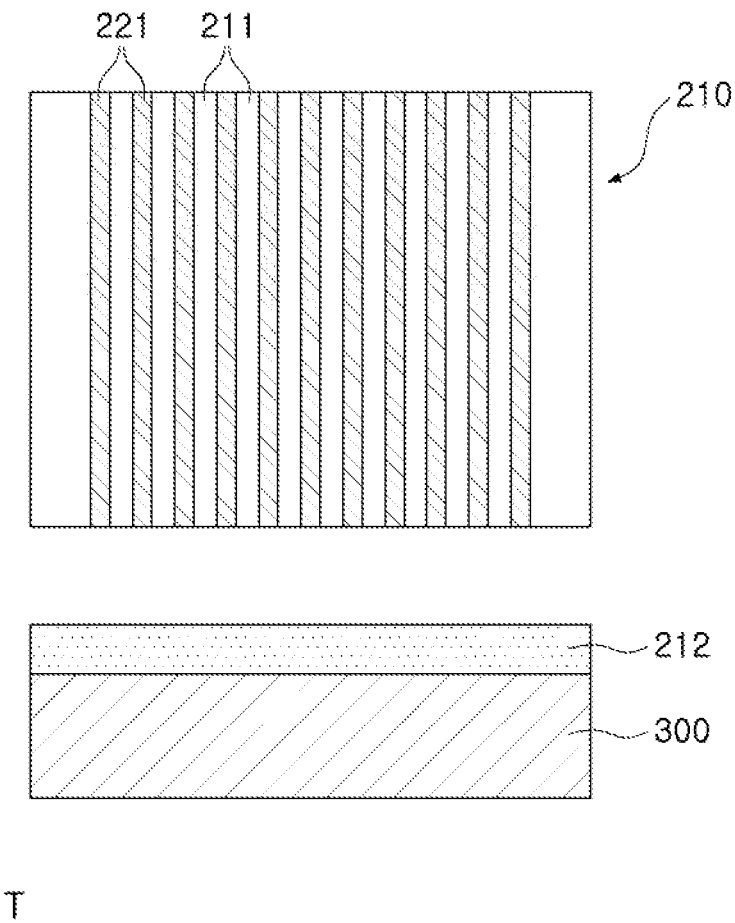

Then, as shown in FIG. 5E, first side margin portion 212 and second side margin portion (not shown) may be formed on the first and second lateral surface of the stack body 210, respectively.

In detail, the first side margin portion 212 may be formed using a method of disposing a lateral-surface ceramic green sheet 212 with adhesives (not shown) coated thereon on a punching elastic member 300 formed of rubber.

Then, the stack body 210 may be rotated at an angle of 90 degrees in such a manner that a first lateral surface of the stack body 210 faces the lateral-surface ceramic green sheet 212 with the adhesives (not shown) coated thereon and, then, the stack body 210 may be pressed-adhered to the lateral-surface ceramic green sheet 212 with the adhesives (not shown) coated thereon.

When the stack body 210 is pressed and adhered to the lateral-surface ceramic green sheet 212 with the adhesives (not shown) coated thereon to transfer the lateral-surface ceramic green sheet 212 to the stack body 210, the lateral-surface ceramic green sheet 212 may be formed to an edge of a lateral surface of the stack body 210 and the remaining portion may be cut due to the punching elastic member 300 formed of a rubber material.

Figure 5F:
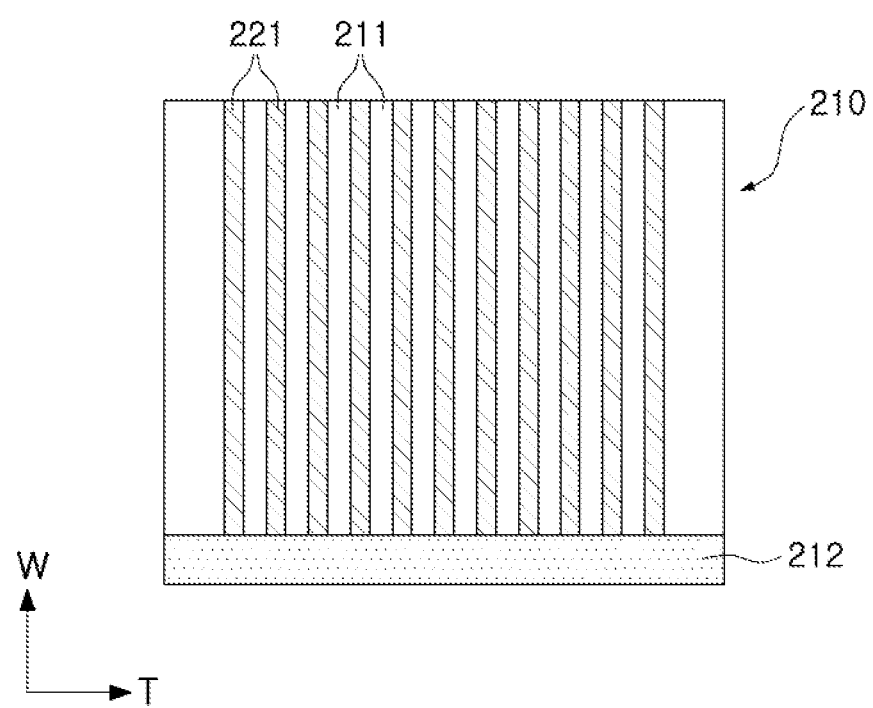

FIG. 5F illustrates the case in which the lateral-surface ceramic green sheet 212 is formed to the edge of the lateral surface of the stack body 210.

Then, the stack body 210 may be rotated and, thus, the second side margin portion may be formed on a second lateral surface of the stack body 210.

Then, a stack body with first and second side margin portions being formed on opposite lateral surfaces of the stack body 210 may be plasticized and sintered to form a ceramic body including a dielectric layer and first and second internal electrodes.

According to an exemplary embodiment of the present disclosure, adhesives are coated on the top of the lateral-surface ceramic green sheet 212 and, thus, the lateral-surface ceramic green sheet 212 may be transferred to a lateral surface of the stack body 210 at low temperature and low pressure, differently from the conventional case.

Accordingly, damage generated in the stack body 210 may be minimized and, thus, the electrical characteristics of a multilayer ceramic capacitor may be prevented from being degraded after being sintered, thereby enhancing reliability.

The lateral-surface ceramic green sheet 212 with adhesives coated thereon may be transferred to a lateral surface of the stack body 210 and may be pressed during a sintering procedure, thereby enhancing adhesive force between the stack body and the lateral-surface ceramic green sheet.

Then, external electrodes may be respectively formed on a third lateral surface of the ceramic body, through which the first internal electrode is exposed, and a fourth lateral surface of the ceramic body, through which the second internal electrode is exposed.

According to another exemplary embodiment of the present disclosure, a lateral-surface ceramic green sheet is thin and has a small thickness deviation to ensure a large capacity formation portion.

In detail, an average thickness of the first and second side margin portions 112 and 113 may be between 2 µm and 10 µm after the first and second side margin portions 112 and 113 are sintered and a large size of the capacity formation portion may be ensured due to a small thickness deviation for each position.

Accordingly, it may be possible to embody a high-capacity multilayer ceramic capacitor.

In addition, a description of the same parts as in the aforementioned exemplary embodiment of the present disclosure is omitted here to avoid repetition of the description.

Although the present disclosure is described below in detail through Experimental Example, this is for aiding in understanding of the present disclosure and the scope of the present disclosure is not limited by Experimental Example.

Experimental Example

With regard to a multilayer ceramic capacitor according to an exemplary embodiment of the present disclosure, Inventive Example is prepared in such a manner that an installation surface installed on a printed circuit board is the fifth surface 5 and the sixth surface 6 of the ceramic body 110.

According to Inventive Example, when the multilayer ceramic capacitor 100 according to an exemplary embodiment of the present disclosure is installed on a printed circuit board, a surface on which the dielectric layer 111 and the plurality of internal electrodes 121 and 122 are stacked may be positioned in parallel to an upper surface of the printed circuit board.

With regard to a multilayer ceramic capacitor according to an exemplary embodiment of the present disclosure, Comparative Example is prepared in such a manner that an installation surface installed on a printed circuit board is a width-direction lateral surface on which a side margin portion is disposed.

According to Comparative Example, a surface on which the dielectric layer 111 and the plurality of internal electrodes 121 and 122 are stacked may be positioned perpendicularly to the upper surface of the printed circuit.

In addition, a ceramic green sheet stack body is formed in such a manner a side margin portion is formed by attaching a lateral-surface ceramic green sheet to an exposed portion of an electrode of a green chip without margin because an internal electrode is exposed in a width direction.

Predetermined temperature and pressure are applied under a condition with minimized modification of a chip and lateral-surface ceramic green sheets are attached to opposite surfaces of a ceramic green sheet stack body to manufacture multilayer ceramic capacitor green chip with 0603 size (width×length×height: 0.6 mm×0.3 mm×0.3 mm).

The completely manufactured multilayer ceramic capacitor test piece is plasticized at 400☐ or less and nitrogen atmosphere, is sintered at sintering temperature of 1200☐ or less and a condition of hydrogen ion concentration of $H_2$ of 0.5% or less, is installed on a printed circuit board and, then, the electrical characteristics such as waterproof characteristics are synthetically checked.

As a measurement result of the experiment, in the case of Comparative Example in which the first surface 1 and the second surface 2 on which the first side margin portion 112 and the second side margin portion 113 are disposed are used as an installation surface, the surface on which the dielectric layer 111 and the plurality of internal electrodes 121 and 122 are stacked is positioned perpendicularly to the upper surface of the printed circuit board and it is seen that failure of 95% or more occurs.

On the other hand, in the case of Inventive Example in which an installation surface installed on a printed circuit board is the fifth surface 5 and the sixth surface 6 of the ceramic body 110, it is seen that failure less than 5% occurs and reliability such as waterproof characteristics is excellent.

As set forth above, according to an exemplary embodiment in the present disclosure, RGB values of a surface of a ceramic body, on which a side margin portion is disposed, and RGB values of a thickness-direction surface of the ceramic body may be differently adjusted, thereby enhancing reliability.

While exemplary embodiments have been shown and described above, it will be apparent to those skilled in the art that modifications and variations could be made without departing from the scope of the present disclosure as defined by the appended claims.

What is claimed is:

1. A multilayer ceramic capacitor comprising:
a ceramic body including a dielectric layer and having first and second surfaces opposing each other in a width direction, third and fourth surfaces connecting the first and second surfaces and opposing each other in a length direction, and fifth and sixth surfaces connected to the first to fourth surfaces and opposing each other in a thickness direction;
an external electrode disposed on an external surface of the ceramic body;
a plurality of internal electrodes disposed inside the ceramic body, exposed through the first and second surfaces, and having one end portion exposed through the third or fourth surface; and
a first side margin portion and a second side margin portion disposed on the first and second surfaces, through which edges of the plurality of internal electrodes are exposed,
wherein RGB values of the first and second surfaces on which the first and second side margin portions are disposed are different from RGB values of the fifth and sixth surfaces which are in parallel with planar surfaces of the plurality of internal electrodes, and
wherein the first and second side margin portions have an average thickness between 2 μm and 10 μm.

2. The multilayer ceramic capacitor of claim 1, wherein the RGB values of the first and second surfaces on which the first and second side margin portions are disposed is greater than the RGB values of the fifth and sixth surfaces which are in parallel with the planar surfaces of the plurality of internal electrodes.

3. The multilayer ceramic capacitor of claim 2, wherein a difference in each of the RGB values between the first and second surfaces on which the first and second side margin portions are disposed and the fifth and sixth surfaces which are in parallel with the planar surfaces of the plurality of internal electrodes is 20 to 40.

4. The multilayer ceramic capacitor of claim 3, wherein a difference in each of the RGB values between the first and second surfaces on which the first and second side margin portions are disposed and the fifth and sixth surfaces which are in parallel with the planar surfaces of the plurality of internal electrodes is 30 to 40.

5. The multilayer ceramic capacitor of claim 1, wherein a ratio of a thickness of a region of the first or second side margin portion, which contacts edges of an outermost layer among the plurality of internal electrodes, to a thickness of a region of the first or second side margin portion, which contacts edges of a central layer among the plurality of internal electrodes, is between 0.9 and 1.0.

6. The multilayer ceramic capacitor of claim 1, wherein a ratio of a thickness of a region of the first or second side margin portion, which contacts a corner edge of the ceramic body, to a thickness of a region of the first or second side margin portion, which contacts edges of a central layer among the plurality of internal electrodes, is between 0.9 and 1.0.

7. The multilayer ceramic capacitor of claim 1, wherein the dielectric layer has a thickness equal to or less than 0.4 μm and eat least one of the plurality of internal electrodes has a thickness equal to or less than 0.4 μm.

8. The multilayer ceramic capacitor of claim 1, wherein a ratio (L/T) of a length of the ceramic body in the length direction to a thickness of the ceramic body in the thickness direction satisfies 0.8>L/T>1.2.

9. The multilayer ceramic capacitor of claim 1, wherein the dielectric layer has a thickness equal to or less than 0.4 μm.

10. The multilayer ceramic capacitor of claim 1, wherein at least one of the plurality of internal electrodes has a thickness equal to or less than 0.4 μm.

11. A multilayer ceramic capacitor comprising:
a ceramic body including a dielectric layer and having first and second surfaces opposing each other in a width direction, third and fourth surfaces connecting the first and second surfaces and opposing each other in a length direction, and fifth and sixth surfaces connected to the first to fourth surfaces and opposing each other in a thickness direction;

an external electrode disposed on an external surface of the ceramic body;

a plurality of internal electrodes disposed inside the ceramic body, exposed through the first and second surfaces, and having one end portion exposed through the third or fourth surface; and a first side margin portion and a second side margin portion disposed on the first and second surfaces, through which edges of the plurality of internal electrodes are exposed, wherein RGB values of the first and second surfaces on which the first and second side margin portions are disposed are different from RGB values of the fifth and sixth surfaces which are in parallel with planar surfaces of the plurality of internal electrodes, and wherein a difference in each of the RGB values between the first and second surfaces on which the first and second side margin portions are disposed and the fifth and sixth surfaces which are in parallel with the planar surfaces of the plurality of internal electrodes is 20 to 40.

12. The multilayer ceramic capacitor of claim 11, wherein the RGB values of the first and second surfaces on which the first and second side margin portions are disposed is greater than the RGB values of the fifth and sixth surfaces which are in parallel with the planar surfaces of the plurality of internal electrodes.

13. The multilayer ceramic capacitor of claim 11, wherein a difference in each of the RGB values between the first and second surfaces on which the first and second side margin portions are disposed and the fifth and sixth surfaces which are in parallel with the planar surfaces of the plurality of internal electrodes is 30 to 40.

14. The multilayer ceramic capacitor of claim 11, wherein a ratio of a thickness of a region of the first or second side margin portion, which contacts edges of an outermost layer among the plurality of internal electrodes, to a thickness of a region of the first or second side margin portion, which contacts edges of a central layer among the plurality of internal electrodes, is between 0.9 and 1.0.

15. The multilayer ceramic capacitor of claim 11, wherein a ratio of a thickness of a region of the first or second side margin portion, which contacts a corner edge of the ceramic body, to a thickness of a region of the first or second side margin portion, which contacts edges of a central layer among the plurality of internal electrodes, is between 0.9 and 1.0.

16. The multilayer ceramic capacitor of claim 11, wherein the dielectric layer has a thickness equal to or less than 0.4 μm and at least one of the plurality of internal electrodes has a thickness equal to or less than 0.4 μm.

17. The multilayer ceramic capacitor of claim 11, wherein the first and second side margin portions have an average thickness between 2 μm and 10 μm.

18. The multilayer ceramic capacitor of claim 11, wherein a ratio (L/T) of a length of the ceramic body in the length direction to a thickness of the ceramic body in the thickness direction satisfies 0.8>L/T>1.2.

19. The multilayer ceramic capacitor of claim 11, wherein the dielectric layer has a thickness equal to or less than 0.4 μm.

20. The multilayer ceramic capacitor of claim 11, wherein at least one of the plurality of internal electrodes has a thickness equal to or less than 0.4 μm.

21. A multilayer ceramic capacitor comprising:

a ceramic body including a dielectric layer and having first and second surfaces opposing each other in a width direction, third and fourth surfaces connecting the first and second surfaces and opposing each other in a length direction, and fifth and sixth surfaces connected to the first to fourth surfaces and opposing each other in a thickness direction;

an external electrode disposed on an external surface of the ceramic body;

a plurality of internal electrodes disposed inside the ceramic body, exposed through the first and second surfaces, and having one end portion exposed through the third or fourth surface; and a first side margin portion and a second side margin portion disposed on the first and second surfaces, through which edges of the plurality of internal electrodes are exposed, wherein RGB values of the first and second surfaces on which the first and second side margin portions are disposed are different from RGB values of the fifth and sixth surfaces which are in parallel with planar surfaces of the plurality of internal electrodes, and wherein the dielectric layer has a thickness equal to or less than 0.4 μm.

22. The multilayer ceramic capacitor of claim 21, wherein the RGB values of the first and second surfaces on which the first and second side margin portions are disposed is greater than the RGB values of the fifth and sixth surfaces which are in parallel with the planar surfaces of the plurality of internal electrodes.

23. The multilayer ceramic capacitor of claim 22, wherein a difference in each of the RGB values between the first and second surfaces on which the first and second side margin portions are disposed and the fifth and sixth surfaces which are in parallel with the planar surfaces of the plurality of internal electrodes is 20 to 40.

24. The multilayer ceramic capacitor of claim 23, wherein a difference in each of the RGB values between the first and second surfaces on which the first and second side margin portions are disposed and the fifth and sixth surfaces which are in parallel with the planar surfaces of the plurality of internal electrodes is 30 to 40.

25. The multilayer ceramic capacitor of claim 21, wherein a ratio of a thickness of a region of the first or second side margin portion, which contacts edges of an outermost layer among the plurality of internal electrodes, to a thickness of a region of the first or second side margin portion, which contacts edges of a central layer among the plurality of internal electrodes, is between 0.9 and 1.0.

26. The multilayer ceramic capacitor of claim 21, wherein a ratio of a thickness of a region of the first or second side margin portion, which contacts a corner edge of the ceramic body, to a thickness of a region of the first or second side margin portion, which contacts edges of a central layer among the plurality of internal electrodes, is between 0.9 and 1.0.

27. The multilayer ceramic capacitor of claim 21, wherein the plurality of internal electrodes has a thickness equal to or less than 0.4 μm.

28. The multilayer ceramic capacitor of claim 21, wherein the first and second side margin portions have an average thickness between 2 μm and 10 μm.

29. The multilayer ceramic capacitor of claim 21, wherein a ratio (L/T) of a length of the ceramic body in the length direction to a thickness of the ceramic body in the thickness direction satisfies 0.8>L/T>1.2.

* * * * *